(12) United States Patent
Padmanabhan et al.

(10) Patent No.: US 10,644,102 B2
(45) Date of Patent: May 5, 2020

(54) SGT SUPERJUNCTION MOSFET STRUCTURE

(71) Applicant: Alpha and Omega Semiconductor (Cayman) Ltd., Grand Cayman (KY)

(72) Inventors: Karthik Padmanabhan, San Jose, CA (US); Lingpeng Guan, San Jose, CA (US); Madhur Bobde, Sunnyvale, CA (US); Jian Wang, Portland, OR (US); Lei Zhang, Portland, OR (US)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 26 days.

(21) Appl. No.: 15/856,828

(22) Filed: Dec. 28, 2017

(65) Prior Publication Data

US 2019/0206988 A1    Jul. 4, 2019

(51) Int. Cl.
| | |
|---|---|
| *H01L 29/06* | (2006.01) |
| *H01L 29/10* | (2006.01) |
| *H01L 29/40* | (2006.01) |
| *H01L 29/78* | (2006.01) |
| *H01L 29/66* | (2006.01) |

(Continued)

(52) U.S. Cl.
CPC ...... *H01L 29/0634* (2013.01); *H01L 21/2253* (2013.01); *H01L 21/26513* (2013.01); *H01L 21/324* (2013.01); *H01L 29/0696* (2013.01); *H01L 29/1095* (2013.01); *H01L 29/407* (2013.01); *H01L 29/66712* (2013.01); *H01L 29/66734* (2013.01); *H01L 29/7802* (2013.01); *H01L 29/7813* (2013.01)

(58) Field of Classification Search
CPC .............. H01L 29/407; H01L 29/1095; H01L 29/7802; H01L 29/0696; H01L 29/7813; H01L 29/0623; H01L 29/66734; H01L 29/0634; H01L 29/66712; H01L 21/2253; H01L 21/26513; H01L 29/0878; H01L 21/324
See application file for complete search history.

(56) References Cited

U.S. PATENT DOCUMENTS

| | | |
|---|---|---|
| 4,754,310 A | 6/1988 | Coe |
| 5,216,275 A | 6/1993 | Chen |

(Continued)

FOREIGN PATENT DOCUMENTS

CN      101924137 A     12/2010

OTHER PUBLICATIONS

Onishi, Y., et al. "SJ-FINFET: a new low voltage lateral superjunction MOSFET." Power Semiconductor Devices and IC's, 2008. ISPSD'08. 20th International Symposium on. IEEE, 2008.

*Primary Examiner* — Jasmine J Clark
(74) *Attorney, Agent, or Firm* — JDI Patent; Joshua Isenberg; Robert Pullman

(57) ABSTRACT

A trench metal-oxide-semiconductor field-effect transistor (MOSFET) device includes a combination of shielded trench gate structure and a superjunction structure within an epitaxial layer including alternating n-doped and p-doped columns in an a drift region. In one example the gate trenches are formed in and over n-doped columns that have an extra charge region near and adjacent to the lower portion of the corresponding gate trench. The extra charge is balanced due to the shield electrodes in the gate trenches.

25 Claims, 6 Drawing Sheets

(51) Int. Cl.
  *H01L 21/265* (2006.01)
  *H01L 21/324* (2006.01)
  *H01L 21/225* (2006.01)

(56) References Cited

U.S. PATENT DOCUMENTS

| | | |
|---|---|---|
| 5,438,215 A | 8/1995 | Tihanyi |
| 5,981,996 A | 11/1999 | Fujishima |
| 6,097,063 A | 8/2000 | Fujihira |
| 6,509,240 B2 | 1/2003 | Ren et al. |
| 6,608,350 B2 | 8/2003 | Kinzer et al. |
| 6,828,631 B2 | 12/2004 | Rumennik et al. |
| 6,835,993 B2 | 12/2004 | Sridevan et al. |
| 6,979,862 B2 | 12/2005 | Henson |
| 7,002,205 B2 | 2/2006 | Onishi et al. |
| 7,176,524 B2 | 2/2007 | Loechelt et al. |
| 7,482,220 B2 | 1/2009 | Loechelt et al. |
| 7,772,668 B2 | 8/2010 | Pan |
| 7,868,384 B2 | 1/2011 | Lee et al. |
| 7,910,486 B2 | 3/2011 | Yilmaz et al. |
| 7,943,989 B2 | 5/2011 | Yilmaz et al. |
| 8,067,800 B2 | 11/2011 | Hsieh |
| 8,299,494 B2 | 10/2012 | Yilmaz et al. |
| 8,324,053 B2 * | 12/2012 | Bobde ............... H01L 29/7806 257/328 |
| 8,373,208 B2 | 2/2013 | Bobde et al. |
| 8,466,510 B2 | 6/2013 | Guan et al. |
| 8,476,698 B2 | 7/2013 | Guan et al. |
| 8,558,275 B2 | 10/2013 | Bobde |
| 8,575,695 B2 | 11/2013 | Bobde et al. |
| 8,866,221 B2 | 10/2014 | Hirler et al. |
| 8,900,949 B2 | 12/2014 | Guan et al. |
| 8,975,720 B2 | 3/2015 | Guan et al. |
| 9,171,949 B1 | 10/2015 | Padmanabhan et al. |
| 9,293,533 B2 | 3/2016 | Fachmann et al. |
| 9,312,381 B1 | 4/2016 | Bobde et al. |
| 9,431,495 B2 | 8/2016 | Ding et al. |
| 9,450,045 B1 | 9/2016 | Bobde et al. |
| 2005/0181577 A1 | 8/2005 | Hshieh |
| 2008/0246149 A1 | 10/2008 | Kwak et al. |
| 2010/0059814 A1 | 3/2010 | Loechelt et al. |
| 2010/0314682 A1 | 12/2010 | Yilmaz et al. |
| 2011/0127586 A1 | 6/2011 | Bobde et al. |
| 2011/0127606 A1 | 6/2011 | Bobde et al. |
| 2011/0220994 A1 | 9/2011 | Parekh et al. |
| 2012/0153503 A1 | 6/2012 | Ponoth et al. |
| 2013/0140633 A1 | 6/2013 | Pattanayak |
| 2014/0124851 A1 | 5/2014 | Gamerith et al. |
| 2015/0155380 A1 * | 6/2015 | Schulze ............... H01L 29/0649 257/330 |

* cited by examiner

SGT SUPERJUNCTION MOSFET STRUCTURE

FIELD OF THE DISCLOSURE

This disclosure relates in general to metal-oxide-semiconductor field-effect transistors (MOSFETs), and more specifically to an improved superjunction device and a method for fabricating the same.

BACKGROUND OF INVENTION

Integrated circuits, such as microprocessors and memory devices, include many metal-oxide-semiconductor field-effect transistors (MOSFETs), which provide the basic switching functions to implement logic gates, data storage, power switching, and the like.

Power MOSFETs have typically been developed for applications requiring power switching and power amplification. In a power MOSFET, it is desirable to reduce the resistance of the device during conduction ($R_{ds-on}$) and improve its breakdown voltage (BV). In a transistor, much of the breakdown voltage (BV) is supported by a drift region, which is lowly doped in order to provide a higher breakdown voltage BV. However, the lowly doped drift region also produces high on-resistance ($R_{ds-on}$). In other words, the on-resistance ($R_{ds-on}$) and the breakdown voltage (BV) are in a tradeoff relation to each other. In fact, the on-resistance $R_{ds-on}$ is proportional to $BV^{2.5}$. That is, the on-resistance ($R_{ds-on}$) increases dramatically with an increase in breakdown voltage (BV) for a conventional transistor.

Superjunction device configurations have been employed to provide a way to achieve low on-resistance ($R_{ds-on}$), while maintaining a high off-state breakdown voltage (BV). Superjunction devices include alternating p-type and n-type doped columns arranged in parallel and connecting to each other in the drift region. The alternating p-type and n-type columns are in substantial charge balance. When a reverse-bias voltage is applied to between the drain and the source, these columns deplete one another (i.e., laterally) at a relatively low voltage so as to withstand a high breakdown voltage in the vertical direction. The on-resistance ($R_{ds-on}$) for a superjunction device increases in direct proportion to the breakdown voltage BV, which is a much less dramatic increase than in a conventional semiconductor structure. A superjunction device may therefore have significantly lower on-resistance ($R_{ds-on}$) than a conventional MOSFET device for the same high breakdown voltage (BV) (or conversely may have a significantly higher breakdown voltage BV than a conventional MOSFET for a given on-resistance $R_{ds-on}$).

Shielded gate trench (SGT) MOSFETs are another type of power MOS devices. They are preferred for certain applications over conventional MOSFETs due to their advantageous characteristics, including reduced gate-to-drain capacitance $C_{gd}$, reduced on-resistance $R_{ds-on}$, and increased breakdown voltage BV of the transistor.

It is within this context that embodiments of the present invention arise.

BRIEF DESCRIPTION OF THE DRAWINGS

Objects and advantages of aspects of the present disclosure will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of designated type of net impurity carriers within a semiconductor material. In general terms, an n+ material has a higher n type net dopant (e.g., electron) concentration than an n material, and an n material has a higher carrier concentration than an n− material. Similarly, a p+ material has a higher p type net dopant (e.g., hole) concentration than a p material, and a p material has a higher concentration than a p− material. It is noted that what is relevant is the net concentration of the carriers, not necessarily dopants. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

In order to reduce on-resistance $R_{ds-on}$ as much as possible, aspects of the present disclosure disclose an improved configuration of a power MOSFET which incorporates a shielded gate trench (SGT) structure in a superjunction device. Specifically, the shield electrode in the SGT structure provides an additional charge balance structure in addition to the superjunction structure. This allows for a higher doping in the n columns and thereby reducing the on-resistance $R_{ds-on}$.

EMBODIMENTS

Figure 1:
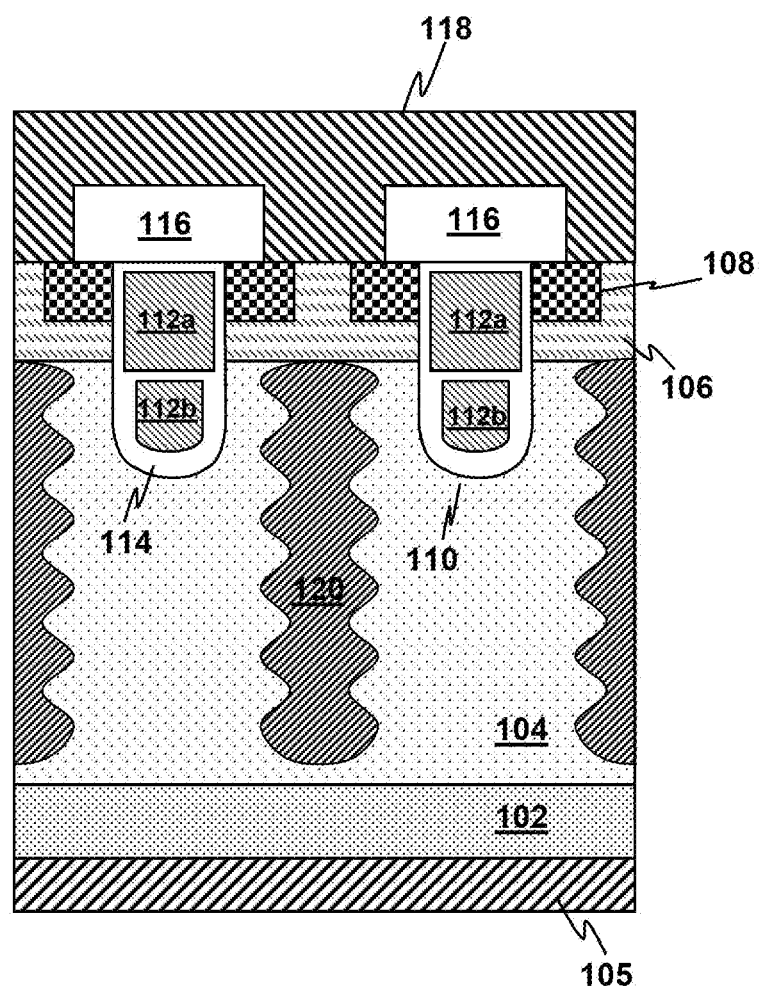
FIG. 1 is a cross-sectional view of part of an active cell portion of a superjunction device according to aspects of the present disclosure.

FIG. 1 is a cross-sectional view of part of an active cell portion of a superjunction device 100 according to aspects of the present disclosure. The active cell portion of the device 100 includes a suitably doped (e.g., n+) substrate 102 serving as a drain region with a drain contact 105, and a suitably-doped (e.g., n drift) region 104 provided on top of the substrate 102. As discussion in connection with the superjunction structure below, the portions of the n drift region 104 may serve as the n columns and have a varying (i.e., non-uniform) doping profile between the top surface of the n drift region 104 and substrate 102. The device 100 also includes a p-type body region 106, an n+ source region 108 formed in the p body region 106, and a gate trench 110 lined with a dielectric material 114. The gate trench 110 has a gate electrode 112a and a shield electrode 112b. The gate electrode 112a is located in the upper portion of the gate trench 110 and the shield electrode 112b is in the lower portion of the trench 110. As seen in FIG. 1, the dielectric material 114 along the inner surface of the lower portion of the gate trench is thicker than that along the inner surface of the upper portion of the trench. The thicker portion of the dielectric material 114 in the lower portion of the trench 110 insulates the shield electrode 112b from the drift region 104 and the thinner portion of the dielectric material 114 in the upper portion of the trench 110 insulates the gate electrode 112a from the body region 106. A bottom of the gate electrode 112a extends slightly below a bottom of the body region 106. It is noted that the shield electrode 112b is also insulated from the gate electrode 112a and shields the gate electrode 112a from the electric field in the drift region 104. Alternatively, the shield electrode 112b may be replaced by a dielectric material such as oxide.

The device 100 also includes an insulating layer 116 formed on the gate trench 110, a gate contact (not shown) and a source metal 118 formed on the insulating layer 116 and connected to the source region 108.

Figure 2:
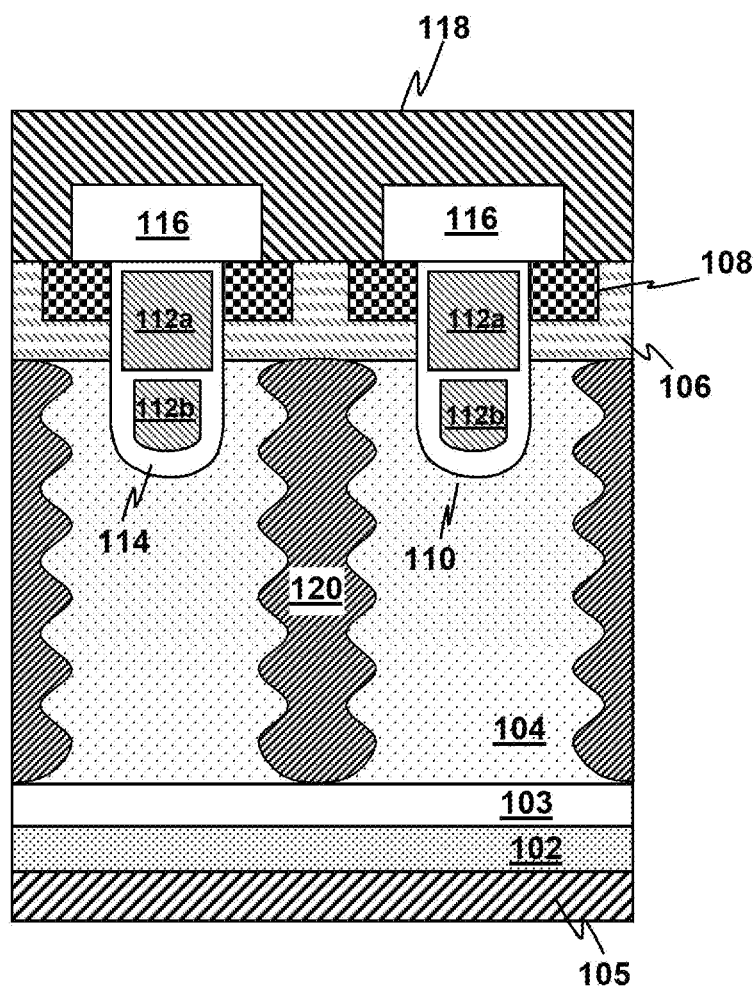
FIG. 2 is a cross-sectional diagram illustrating a doping profile for the drift region of a superjunction device according to aspects of the present disclosure.

The device 100 includes a superjunction structure which has alternating p doped columns and n doped columns. As seen in FIG. 1, a p column 120 is formed between two adjacent gate trenches 110 in the drift region 104, extending from the bottom of the body region 106 through an entire depth of the shield electrode 112b to a depth deeper than a bottom of the gate trenches 110. In a preferred embodiment, the total depth of the p column 120 is at least 3 times of the depth of the shield electrode 112b. The n columns may comprise of the portions of the n drift region 104 that are situated adjacent to the p columns 120. The p column 120 may reach to the substrate layer 102 or terminate above the substrate layer 102. In an alternative embodiment in FIG. 2, a lightly n type doped buffer layer 103 is provided between the substrate layer 102 and the n drift region 104 seperating the p column 120 from the substrate layer 102. As shown in FIG. 1 and FIG. 2, the p column 120 and the n column formed by the n drift region 104 achieve charge balance in operation. With the shield electrode 112b in the gate trench 110, a top portion of the n drift region 104 between adjacent p columns 120 is occupied by the lower portion of the gate trench 110. Thus, the n charge density in the n columns has to be increased to compensate for the presence of the shield electrode to maintain the charge balance in the drift region. In this regard, the n columns have an extra n charge density region formed near and adjacent to the bottom portion of the gate trench 110. In order to increase n charge density, the doping concentration in the n columns (especially near and adjacent to the bottom portion of the gate trench 110) is increased. As a result, the on-resistance $R_{ds\text{-}on}$ is further reduced.

It is noted that the semiconductor substrate 102, the drift region 104 and the source region 108 are of the same conductivity type (e.g., an n-type). The body region 106 and the doped column 120 are of a conductivity type opposite to that of the substrate 102 (e.g., a p-type).

Figure 3:
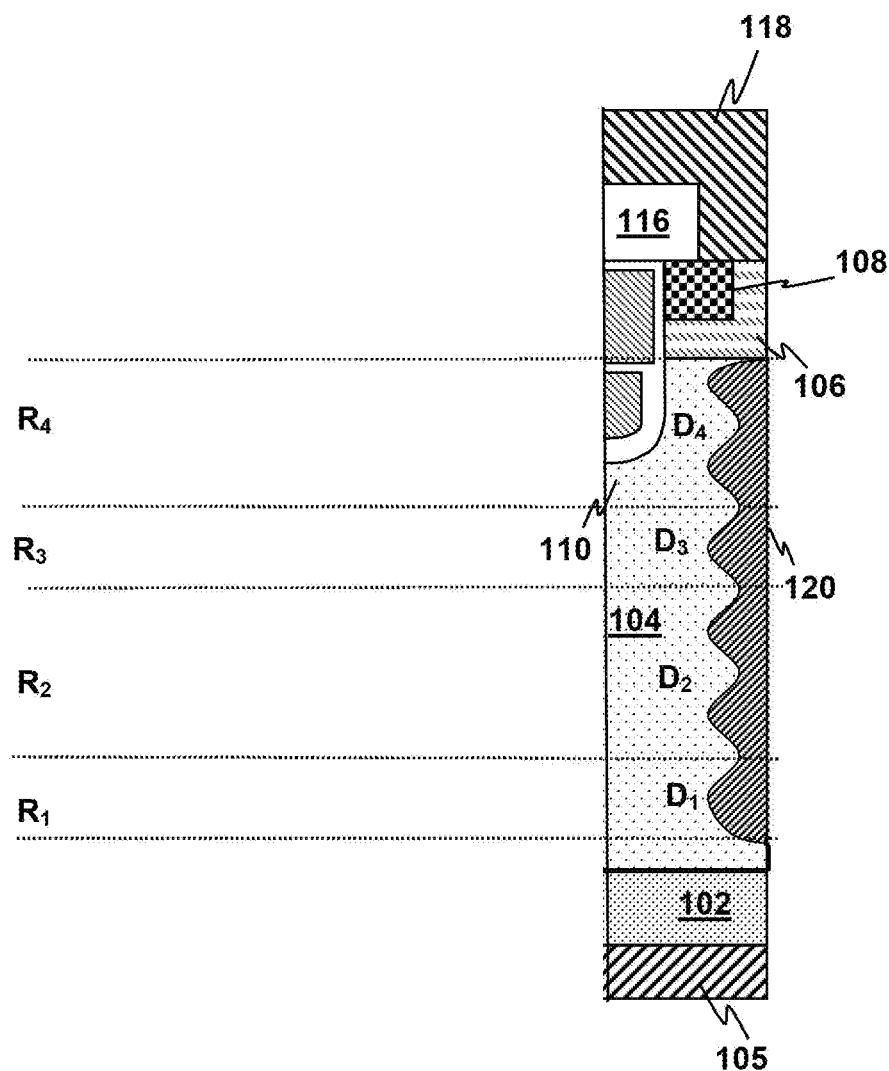
FIG. 3 is a partial cross-sectional diagram illustrating a doping profile for the drift region of a shielded gate trench (SGT) superjunction device according to aspects of the present disclosure.

In one embodiment, the n and p columns may be formed by a conventional process (e.g., forming multiple layers of epitaxial silicon followed by implantation of one or two dopants step before the formation of the next epitaxial layer and then diffusion drive the dopants to form the columns through a thermal activation). The n and p columns may have a varying doping profile across the drift region. FIG. 3 illustrates the activated net dopant profiles for the n columns of a superjunction device according to aspects of the present disclosure. The n and p columns may be divided into four regions $R_1$, $R_2$, $R_3$ and $R_4$ from the bottom to the top. Each of the four regions of the n and p columns may include one or more epitaxial layers where each layer may be characterized by a lobe of the p implant diffusion in each epitaxial layer. The n column in each of four regions $R_1$, $R_2$, $R_3$ and $R_4$ has a net charge density $D_1$, $D_2$, $D_3$ and $D_4$ respectively. As shown in FIG. 3, the gate trenches 110 terminate within $R_4$ region. The doping concentration $D_4$ of the n column in the top region $R_4$ (i.e., near the p body region 106) is higher than the doping concentration $D_1$ of the n column in region $R_1$ near the substrate 102. The extra n charge region formed near and adjacent to the gate trench 110 has a largest n-type doping concentration thus the largest net charge concentration comparing to other areas in the n drift region 104. By way of example, but not limitation, the extra n charge region may be formed by increasing the implantation doses for the top portion of the drift region 104. In one embodiment, the extra n charge region in proximity to the shield electrode 112a has about 20-50% more charges than a conventional superjunction device where the n columns have the top portion net charge concentration not more than the bottom portion net charge concentration. In a preferred embodiment of FIG. 3, the n column in the top region $R_4$ has a charge density $D_4$ that is 20-50% higher than the n column charge density $D_1$ in the bottom region $R_1$. In another embodiment, the n column in the $R_3$ region next to the top region $R_4$ has a charge density $D_3$ substantially the same as the n column charge density $D_1$ in the bottom region $R_1$. In another embodiment, the n column in the $R_3$ region next to the top region $R_4$ has a charge density $D_3$ substantially the same as the n column charge density $D_1$ in the bottom region $R_1$ but less than the n column charge density $D_4$ in the top region $R_4$. In another embodiment, charge densities $D_1$, $D_2$ and $D_3$ of the n column in each regions $R_1$, $R_2$ and $R_3$ below the top region $R_4$ are substantially the same but less than the n column charge density $D_4$ in the top region $R_4$. In yet another embodiment, the n column in region $R_2$ above the bottom region $R_1$ has a charge density $D_2$ that is less than the n column charge density $D_1$ in the bottom region $R_1$. In yet another embodiment, the n column charge density $D_3$ in the $R_3$ region next to the top region $R_4$ is substantially the same as the n column charge density $D_1$ in the bottom region $R_1$ but higher than the n column charge density $D_2$ in region $R_2$ above the bottom region $R_1$ and less than the n column charge density $D_4$ in the top region $R_4$. Lower dopant concentration in region $R_2$ right above the bottom region $R_1$ provides the benefit of increasing the breakdown voltage which may have been decreased due to conventional dopant grading scheme in conventional superjunction devices. Such conventional dopant grading sacrifices the peak breakdown voltage to have a larger tolerance of charge mismatch in the p and n columns therefore the charge implant control precision can be loosen to make it easier to manufacturer and to improve device performance uniformity. In some embodiments the n column charge density $D_2$ in region $R_2$ can be as low as 60% of the n column charge density $D_3$ in the $R_3$ region above region $R_2$ and the n column charge density $D_1$ in the bottom region $R_1$ below region $R_2$.

Figure 4:
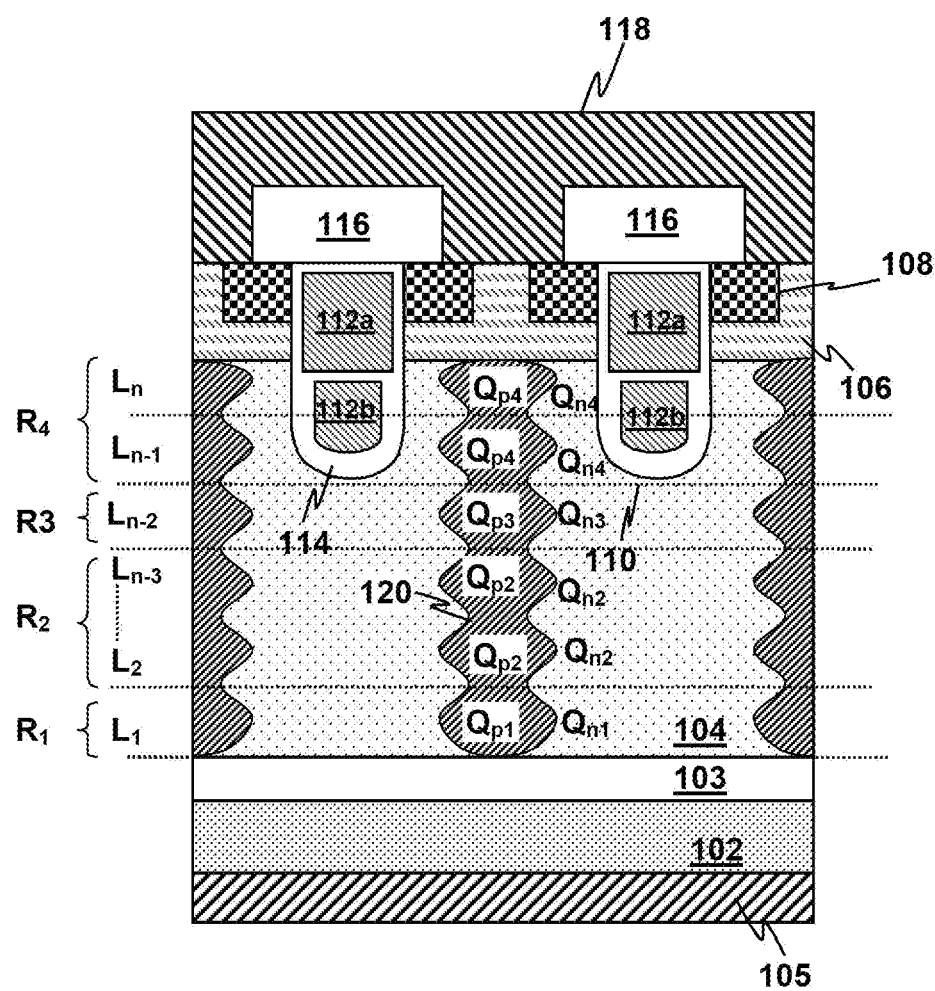
FIG. 4 is a cross-sectional diagram illustrating an example of an implementation of an SGT superjunction device according to aspects of the present disclosure.

FIG. 4 illustrates the activated net dopant profiles for both the n columns and p columns of a superjunction device according to aspects of the present disclosure. The n and p columns may be divided into four regions $R_1$, $R_2$, $R_3$ and $R_4$ from the bottom to the top. Each of the four regions of the n and p columns may include one or more epitaxial layers where each layer may be characterized by a lobe of the p implant diffusion in each epitaxial layer. In the embodiment shown in FIG. 4, the top region $R_4$ includes two epitaxial layers $L_n$ and $L_{n-1}$ but could include more or fewer epitaxial layers. Each of the gate trenches 110 terminates within $R_4$ region. The region $R_3$ next to the top region $R_4$ includes one epitaxial layer $L_{n-3}$ but could include more epitaxial layers. The bottom region $R_1$ includes one epitaxial layer L1 but could include more epitaxial layers. The region $R_2$ next above the bottom region $R_1$ includes two or more epitaxial layer $L_2$ to $L_{n-3}$. The n columns in each epitaxial layer of the four regions $R_1$, $R_2$, $R_3$ and $R_4$ has a net charge dose $Q_{n1}$, $Q_{n2}$, $Q_{n3}$ and $Q_{n4}$, respectively. The p columns in the epitaxial layers of the four regions $R_1$, $R_2$, $R_3$ and $R_4$ have corresponding net charge doses $Q_{p1}$, $Q_{p2}$, $Q_{p3}$ and $Q_{p4}$ respectively. To achieve consistent high breakdown voltage, it is preferred that $Q_{n2}$ is substantially the same as $Q_{p2}$ such that the charges in the n and p columns in each epitaxial layer in the $R_2$ region are balanced, while in the top regions the p column may have excess charge compared to the n column and in the bottom region the n column may have excess charge compared to the p column.

In the implementation shown in FIG. 4, $Q_{n4}$ is larger than $Q_{p4}$ and $Q_{n3}$ is less than $Q_{p3}$. In a preferred embodiment of such an implementation, $Q_{n4}$ is 30% to 70% larger than $Q_{p4}$ and $Q_{n3}$ is 4% to 8% less than $Q_{p3}$. In another embodiment, $Q_{n4}$ is larger than $Q_{p4}$ and $Q_{n1}$ is larger than $Q_{p1}$. In another embodiment, $Q_{n4}$ is larger than $Q_{p4}$, $Q_{n3}$ is less than $Q_{p3}$, and $Q_{n1}$ is larger than $Q_{p1}$.

For the implementations described above for FIG. 3 and FIG. 4, the dose for the n column in each epitaxial layer may be varied for different regions. In a preferred embodiment, the n column has a dose $Q_{n4}$ in each epitaxial layer in the top region $R_4$ higher than the n column dose $Q_{n1}$ in each epitaxial layer in the bottom region $R_1$. In another embodiment, the n column in the $R_3$ region next to the top region $R_4$ has a dose $Q_{n3}$ in each epitaxial layer substantially the same as the n column dose $Q_{n1}$ in each epitaxial layer in the bottom region $R_1$. In another embodiment, the n column in the $R_3$ region next to the top region $R_4$ has a dose $Q_{n3}$ in each epitaxial layer substantially the same as the n column dose $Q_{n1\ in}$ each epitaxial layer in the bottom region $R_1$ but less than the n column dose $Q_{n4}$ in each epitaxial layer in the top region $R_4$. In another embodiment, the n column doses $Q_{n1}$, $Q_{n2}$ and $Q_{n3}$ in each epitaxial layer of each regions $R_1$, $R_2$ and $R_3$ below the top region $R_4$ are substantially the same but less than the n column dose $Q_{n4}$ in each epitaxial layer in the top region $R_4$. In yet another embodiment, the n column in region $R_2$ above the bottom region $R_1$ has a dose $Q_{n2}$ in each epitaxial layer that is less than the n column dose $Q_{n1}$ in each epitaxial layer in the bottom region $R_1$. In yet another embodiment, the n column dose $Q_{n3}$ in each epitaxial layer in the $R_3$ region next to the top region $R_4$ is substantially the same as the n column dose $Q_{n1}$ in each epitaxial layer in the bottom region $R_1$ but higher than the n column dose $Q_2$ in each epitaxial layer in region $R_2$ above the bottom region $R_1$ and less than the n column dose $Q_{n4}$ in each epitaxial layer in the top region $R_4$. Lower dopant concentration in region $R_2$ right above the bottom region $R_1$ provides the benefit of increasing the breakdown voltage which may have been decreased due to conventional dopant grading scheme in conventional superjunction devices. Such conventional dopant grading sacrifices the peak breakdown voltage to have a larger tolerance of charge mismatch in the p and n columns therefore the charge implant control precision can be loosened to make the device easier to manufacture and to improve device performance uniformity. In some embodiments the n column dose $Q_{n2}$ in each epitaxial layer in region $R_2$ can be as low as 60% of the n column dose $Q_{n3}$ in each epitaxial layer in the $R_3$ region above region $R_2$ and the n column dose $Q_{n1}$ in each epitaxial layer in the bottom region $R_1$ below region $R_2$. In all embodiments, $Q_{n4}$ may be up to 70% more than $Q_{n1}$. Alternatively, the doses in the p column can be arranged such that the p column doses $Q_{p1}$, $Q_{p2}$ and $Q_{p3}$ in each epitaxial layer of each regions $R_1$, $R_2$ and $R_3$ below the top region $R_4$ are substantially the same as the p column dose $Q_{p4}$ in each epitaxial layer in the top region $R_4$, or the p column dose $Q_{p3}$ in each epitaxial layer in the $R_3$ region next to the top region $R_4$ is substantially the same as the p column dose $Q_{p1}$ in each epitaxial layer in the bottom region $R_1$ but higher than the p column dose $Q_{p2}$ in each epitaxial layer in region $R_2$ above the bottom region $R_1$. The addition of the SGT structure in the superjunction device according to the aspects of the present disclosure may reduce about 15% of the on-resistance $R_{ds-on}$ comparing to a conventional superjunction device. In order to get the beneficial effect of the increased n charge in compensation for the presence of the shield electrode 112b, the gate trench 110 is formed over and in the n column (i.e., the n drift region 104) and the bottom of the shield electrode should be shallower than the extra n charge region. The gate trench 110 cannot be wider than the n column. By way of example but not limitation, the ratio of the gate trench width to superjunction pitch is about 0.175. In one embodiment, the trench has a width of 0.9 microns for a trench with a depth of 5-6 microns. In addition, in order to maintain charge balance in the drift region, the gate trench 110 should be centered in the n-column and between the two adjacent p columns. If the gate trench 110 is off center, it would result in a loss of charge balance. By way of example but not limitation, a misalignment tolerance is about 0.1 to 0.2 microns for a trench in a width of 1.4 micron in a superjunction structure having an 8 micron pitch. Alternatively, the n charge in the drift region 104 can be adjusted to compensate for possible misalignment.

Figure 5:
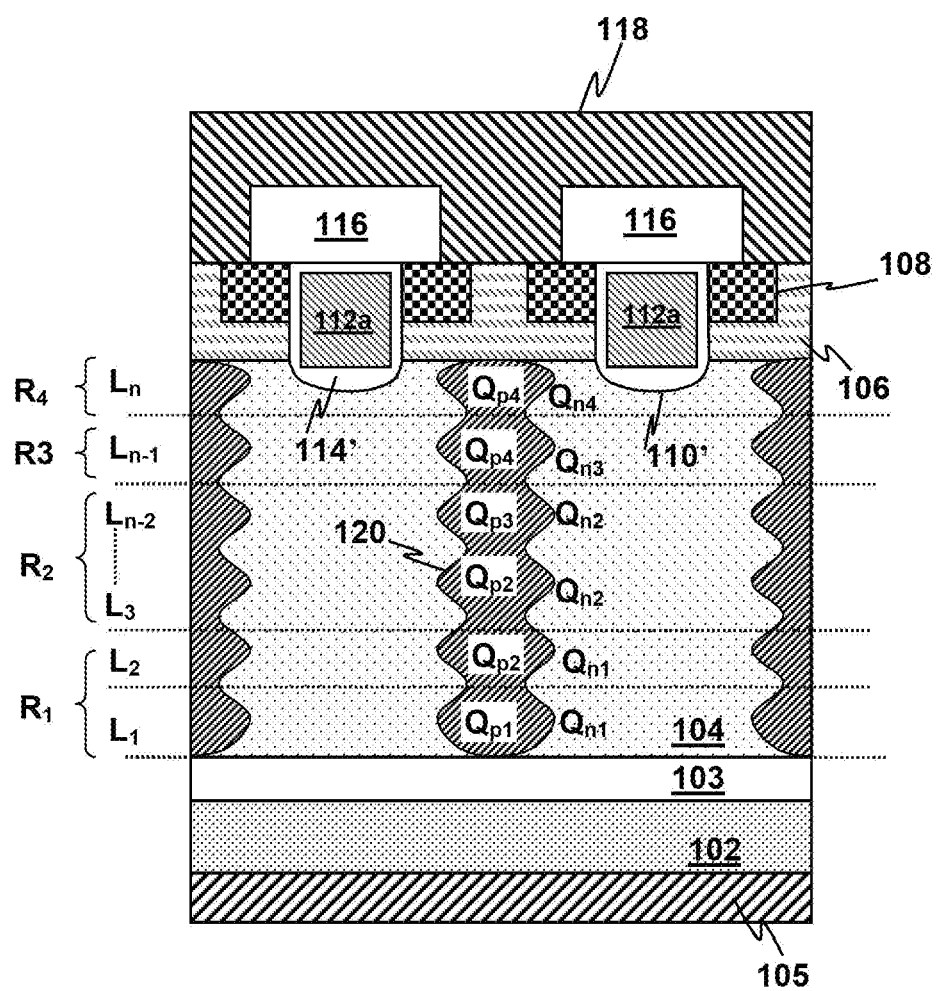
FIG. 5 is a cross-sectional diagram illustrating an example of an implementation of a superjunction device according to aspects of the present disclosure.

FIG. 5 illustrates an alternative implementation of a superjunction device where the effect of trench misalignment can be reduced. The device shown in FIG. 5 is essentially the same as the device depicted in FIG. 4 except the gate trench 110' is much shallower than the gate trench 110 such that only a gate electrode 112a is formed inside the trench 110'. The gate oxide 114' is thicker at the bottom of the gate trench 110'. Since the gate trench 110' is shallow, the top region $R_4$ includes only one epitaxial layer $L_n$. The gate trench 110' terminates within the top region $R_4$. The region $R_3$ next to the top region $R_4$ includes one epitaxial layer $L_{n-1}$ but could include more than epitaxial layers. The bottom region $R_1$ includes two epitaxial layers $L_1$ and $L_2$ but could include fewer or more epitaxial layers. The region $R_2$ next above the bottom region $R_1$ includes two or more epitaxial layers $L_3$ to $L_{n-2}$. The doses of each epitaxial layer in the p and n columns are similar to those in FIGS. 3 and 4 except that $Q_{n4}$ is reduced therefore $D_4$ is reduced. In a preferred embodiment, Qn4 is 10% to 30% larger than $Q_{p4}$ and $Q_{n3}$ is 4% to 8% less than $Q_{p3}$. In another preferred embodiment, Qn4 may be up to 30% more than $Q_{n1}$.

Figure 6:
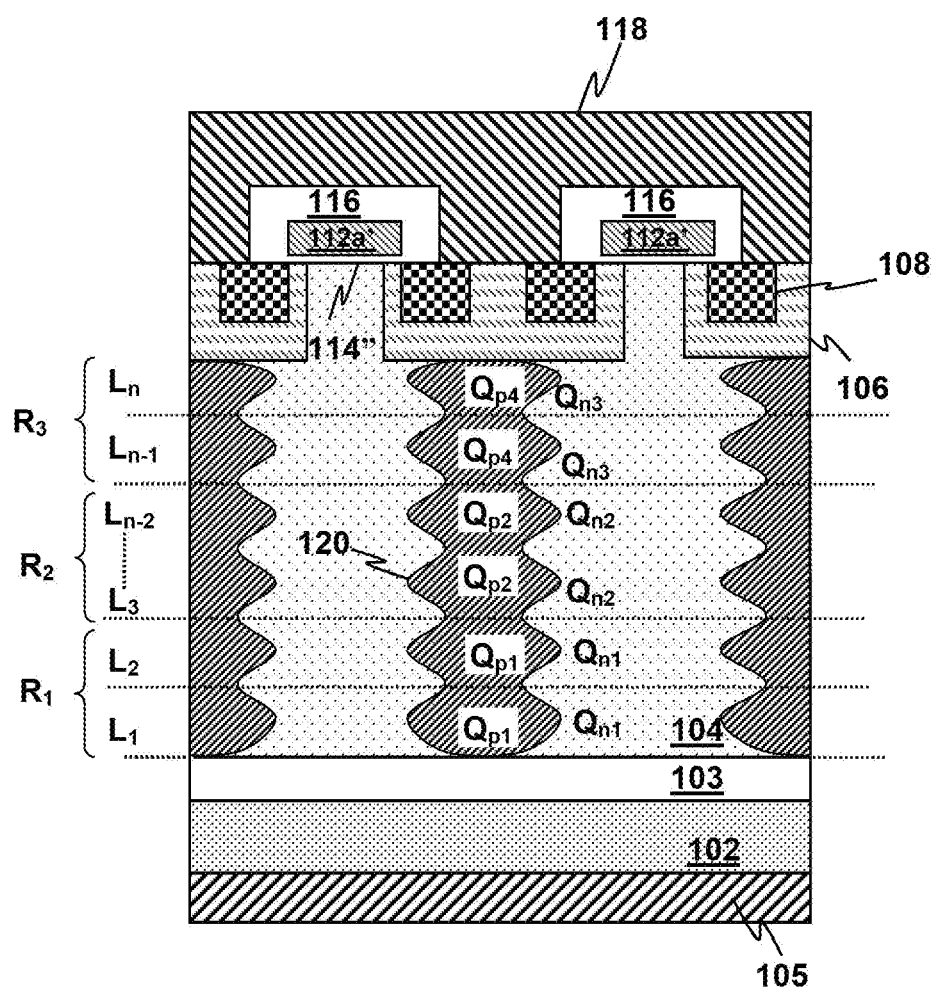
FIG. 6 is a cross-sectional diagram illustrating an example of another alternative implementation of a planar gate superjunction device according to aspects of the present disclosure.

FIG. 6 illustrates an alternative implementation with a planar gate configuration where there is no effect of trench misalignment. The device shown in FIG. 6 is the same as the device in FIG. 5 except a planar gate 112a' is formed on a gate dielectric layer 114" on top of the semiconductor instead of inside a trench. Since there is no trench the top region $R_4$ of each p and n columns is omitted. The region $R_3$ near the body region 106 includes two epitaxial layers $L_n$ and $L_{n-1}$ but could include fewer or more epitaxial layers. The bottom region $R_1$ includes two epitaxial layers $L_1$ and $L_2$ but could include less or more epitaxial layers. The middle region $R_2$ next above the bottom region $R_1$ includes two or more epitaxial layer $L_3$ to $L_{n-2}$. The doses of each epitaxial layer in the p and n columns in regions $R_1$, $R_2$ and $R_3$ are similar to the corresponding doses in each epitaxial layer in the p and n columns in regions $R_1$, $R_2$ and $R_3$ of FIGS. 3 and 4.

The addition of the SGT structure in the superjunction device according to the aspects of the present disclosure may reduce about 15% of the on-resistance $R_{ds-on}$ comparing to a conventional superjunction device.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC § 112, 6.

What is claimed is:

1. A metal-oxide-semiconductor field-effect transistor (MOSFET) device, comprising:
    a drift region of a first conductivity type provided on top of a heavily doped substrate of a same conductivity type;
    a body region of a second conductivity type that is opposite to the first conductivity type provided above the drift region;
    a plurality of trenches provided in the body region and extending into the drift region;
    a heavily doped source region of the first conductivity type provided in the body region; and
    a superjunction structure provided in the drift region including alternating first doped columns of the first conductivity type and second doped columns of the second conductivity type arranged in parallel, wherein each of the second doped columns is provided between two adjacent trenches, wherein each of the first doped columns has an extra charge density region near and adjacent to a corresponding one of the plurality of trenches, wherein the alternating first doped columns and the second doped columns are in substantial charge balance in the drift region.

2. The device of claim 1, wherein each of the plurality of trenches is centered at a top portion of a first doped column and between two adjacent second doped columns.

3. The device of claim 1, wherein each of the plurality of trenches has a bottom that terminates in the extra charge density region.

4. The device of claim 1, wherein each of the plurality of trenches is no wider than a width of a corresponding one of the first doped columns.

5. The device of claim 1, wherein the first doped columns have a varying doping profile across the drift region, wherein a region above a bottom region and below the extra charge density region has a net charge density lower than a net charge density in the bottom region.

6. The device of claim 1, wherein the extra charge density region near and adjacent to a lower portion of the corresponding one of the plurality of trenches has a largest doping concentration comparing to other regions in the first doped columns.

7. The device of claim 1, wherein each trench of the plurality of trenches is lined with a dielectric material has a gate electrode in the upper portion and a shield electrode in the lower portion.

8. The device of claim 1, wherein each trench of the plurality of trenches is lined with a dielectric material has a gate electrode in the upper portion and a dielectric material filling a lower portion of each of the plurality of trenches.

9. The device of claim 1, wherein the extra charge density region has about 20% to 50% higher charge density than other portions of the first doped columns.

10. The device of claim 1, wherein a ratio of gate trench width to superjunction pitch is about 0.175.

11. A metal-oxide-semiconductor field-effect transistor (MOSFET) device, comprising:
    a drift region of the a conductivity type provided on top of a heavily doped layer of a same conductivity type;
    a body region of a second conductivity type that is opposite to the first conductivity type provided above the drift region;
    a plurality of trenches provided in the body region and extending into the drift region;
    a heavily doped source region of the first conductivity type provided in the body region; and
    a superjunction structure provided in the drift region including alternating first doped columns of the first conductivity type and second doped columns of the second conductivity type arranged in parallel, wherein each of the second doped columns is provided between two adjacent trenches, wherein each of the first doped columns and the second doped columns extends below a bottom of the trenches, wherein the alternating first doped columns and the second doped columns are in substantial charge balance in the drift region.

12. The device of claim 11, wherein each of the plurality of trenches is centered at a top portion of a first doped column and between two adjacent second doped columns.

13. The device of claim 12, wherein each of the plurality of trenches has a bottom terminated in a top portion of a corresponding one of the first doped column.

14. The device of claim 11, wherein each trench of the plurality of trenches is narrower than a width of a corresponding one of the first doped columns.

15. The device of claim 11, wherein the first doped columns have a varying doping profile across the drift region, wherein a region above a bottom region and below a top region has a net charge density lower than a net charge density in the bottom region.

16. The device of claim 11, wherein a top region in the first doped columns near and adjacent to a lower portion of the corresponding one of the plurality of trenches has a largest net charge doping concentration comparing to other regions in the first doped columns.

17. The device of claim 11, wherein each trench of the plurality of trenches is lined with a dielectric material has a gate electrode in the upper portion and a shield electrode in the lower portion.

18. The device of claim 11, wherein each trench of the plurality of trenches is lined with a dielectric material has a gate electrode in the upper portion and a dielectric material filling a lower portion of each of the plurality of trenches.

19. A superjunction semiconductor device, comprising:
a drift region of a first conductivity type provided on top of a heavily doped layer of a same conductivity type;
a body region of a second conductivity type that is opposite to the first conductivity type provided above the drift region; and
a superjunction structure provided in the drift region including alternating first doped columns of the first conductivity type and second doped columns of the second conductivity type arranged in parallel, wherein the first doped columns have a varying doping profile across the drift region, wherein a middle region above a bottom region and below an upper region has a net charge density lower than a net charge density in the bottom region and the upper region, wherein the alternating first doped columns and the second doped columns are in substantial charge balance in the drift region.

20. The device of claim 19, wherein each of the bottom region, the middle region and the upper region in each of the first doped columns comprises a plurality of epitaxial layers doped with the first conductivity.

21. The device of claim 20, wherein each of the plurality of epitaxial layers doped with the first conductivity in the middle region has a dose lower than a dose in each epitaxial layer in the bottom region and the upper region.

22. The device of claim 19, wherein each of the first doped columns further comprising a top region above the upper region.

23. The device of claim 22, wherein each of the bottom region, the middle region, the upper region and the top region in each of the first doped columns comprises a plurality of epitaxial layers doped with the first conductivity, wherein each of the plurality of epitaxial layers doped with the first conductivity in the top region has a dose higher than a dose in each epitaxial layer in the bottom region, the middle region and the upper region.

24. The device of claim 19, wherein each of the first doped columns further comprises a top region above the upper region, wherein each of the plurality of epitaxial layers doped with the first conductivity in the top region has a dose higher than a dose in each epitaxial layer in the bottom region, the middle region and the upper region.

25. A superjunction semiconductor device, comprising:
a drift region comprising a superjunction structure provided in the drift region including alternating first doped columns of a first conductivity type and second doped columns of the second conductivity type arranged in parallel, wherein the first doped columns comprising a plurality of epitaxial layers doped with the first conductivity having a varying doping profile across the drift region, wherein a middle region above a bottom region and below an upper region has a dose for each epitaxial layer lower than a dose in each of epitaxial layer in the bottom region and in the upper region, wherein the alternating first doped columns and the second doped columns are in substantial charge balance in the drift region.

* * * * *